United States Patent [19]

Neppl et al.

[11] Patent Number: 4,912,543
[45] Date of Patent: Mar. 27, 1990

[54] INTEGRATED SEMICONDUCTOR CIRCUIT HAVING AN EXTERNAL CONTACTING TRACK LEVEL CONSISTING OF ALUMINUM OR OF AN ALUMINUM ALLOY

[75] Inventors: Franz Neppl; Ulrich Schwabe, both of Munich, Fed. Rep. of Germany

[73] Assignee: Siemens Aktiengesellschaft, Berlin and Munich, Fed. Rep. of Germany

[21] Appl. No.: 592,403

[22] Filed: Mar. 22, 1984

[30] Foreign Application Priority Data

Jul. 20, 1983 [DE] Fed. Rep. of Germany ....... 3326142

[51] Int. Cl.$^4$ ................... H01L 23/54; H01L 21/441
[52] U.S. Cl. ........................................ 357/67; 357/71
[58] Field of Search .................... 357/71, 67; 148/33, 148/147

[56] References Cited

U.S. PATENT DOCUMENTS

| 4,201,999 | 5/1980 | Howard et al. | 357/15 |
| 4,276,557 | 6/1981 | Levinstein et al. | 357/67 |
| 4,385,433 | 5/1983 | Ozawa | 357/67 |
| 4,389,257 | 6/1983 | Geipel, Jr. et al. | 148/1.5 |

FOREIGN PATENT DOCUMENTS 0165680  12/1980  Japan ..................................... 357/67

OTHER PUBLICATIONS

"Refractory Silicides for Integrated Circuits"—Murarka—J. Vac. Sci. Technology, Jul./Aug. 1982, pp. 775–792.
"Refractory Silicides of Titanium and Tantalum for Low Resistivity Gates and Interconnects"—Murarka et al.—IEEE Journal of Solid—State Circuits, vol. SC—15, No. 4, Aug. 1982, pp. 474–482.
"Thin Solid Films", vol. 96, (1982), pp. 327–345.

Primary Examiner—Rolf Hille
Assistant Examiner—S. V. Clark
Attorney, Agent, or Firm—Hill, Van Santen, Steadman & Simpson

[57] ABSTRACT

An integrated semiconductor circuit including a substrate consisting of silicon having a heavily doped impurity layer formed thereon. An interconnect level consisting of aluminum or aluminum alloy is connected to the contact regions by means of an intermediate layer consisting of tantalum silicide. The tantalum content of the compound is greater than that required stoichiometrically to produce the intermetallic compound $TaSi_2$. The interconnect level is preferably in the form of an aluminum or aluminum alloy-tantalum silicide double layer. The tantalum silicide layer simultaneously acts as a diffusion barrier and as a contacting material. The lifetime of the electrically conducting paths under temperature and current stress as well as the reliability of the contacts is significantly increased in VLSI circuits as a result of this metallization.

5 Claims, 1 Drawing Sheet

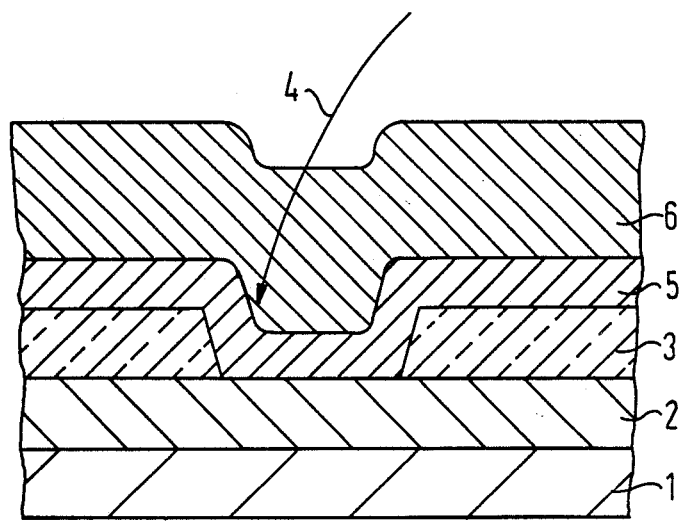

INTEGRATED SEMICONDUCTOR CIRCUIT HAVING AN EXTERNAL CONTACTING TRACK LEVEL CONSISTING OF ALUMINUM OR OF AN ALUMINUM ALLOY

BACKGROUND OF THE INVENTION

1. Field of the Invention

This invention is in the field of integrated semiconductor circuits including a substrate of silicon, an external contacting track level consisting of aluminum or an aluminum alloy, the contacting track level being connected to the active substrate regions by means of a metal silicide intermediate layer.

2. Description of the Prior Art

External interconnect levels consisting of aluminum or an aluminum alloy have been provided with intermediate layers of platinum silicide to connect the same to the diffused silicon regions, as described in an article by Ting and Wittmer in "Thin Film Solids", vol. 96 (1982), page 331. The reaction temperature is at about 400° C.

The article by Ting and Wittmer also describes metallizations for integrated circuits based on aluminum or aluminum alloys such as aluminum-silicon and silicides. The thermal instability occurs at about 550° C. The metallization system described, however, has some disadvantages. First, the formation of small contacts to flat, highly doped diffusion regions in the silicon substrate is very problematical because of the danger of substrate shorts due to so-called "spiking", and/or epitaxial p-silicon growth into the contacts, resulting in degradation of n+ contacts.

Second, it is very difficult to manufacture a temperature-stable Schottky diode with a low forward barrier height $\phi_B$ on n-silicon as are required, for example, for "clamped transistors" that are employed in Schottky transistor-transistor logic (TTL) circuits or in combined complementary metal-oxide-semiconductor (CMOS)/Schottky TTL circuits since the aluminum generally diffuses through most low barrier silicides to the interface and increases the barrier height.

These disadvantages can largely be eliminated by providing further layers as diffusion barriers in addition to the contacting silicide layer. For example, a three-layer system consisting of aluminum, titanium and platinum silicide wherein the platinum silicide is located only in the contact hole is described on page 338 of the aforementioned article by Ting and Wittmer.

U.S. Pat. No. 4,201,999 to Howard describes a three-layer system consisting of tantalum, tantalum-aluminum and aluminum for reducing Schottky forward barrier heights on n-silicon. The disadvantage of this type of metallization is that tantalum tends to silicide formation at relatively low temperatures when in contact with silicon, thereby creating the possibility of substrate shorts.

These known layer systems further require additional process steps which add considerably to the cost and which can increase the rejection rates in the manufacture of the integrated circuits.

SUMMARY OF THE INVENTION

The present invention employs a metallization system based on aluminum which is not only easier to apply and is more simply constructed but also further increases the reliability and loadability of electric conducting paths and contacts to flat diffusion regions in very large scale integration (VLSI) systems.

The present invention is concerned with an integrated semiconductor circuit of the type previously described which is characterized in that the intermediate layer consists of tantalum silicide in which the tantalum content of the silicide component is in molar excess of that required stoichiometrically to form the intermetallic compound $TaSi_2$. In a preferred form of the invention, there are at least 1.1 moles of tantalum for every 2 moles of silicon.

In keeping with the present invention, the tantalum silicide layer may be generated by means of simultaneous vapor deposition of the two elements or by means of a high frequency sputtering using a target consisting of tantalum silicide. The tantalum silicide is deposited in amorphous form with this type of manufacture.

In another embodiment of the present invention, the tantalum silicide layer may be formed by means of deposition from the vapor phase, for example, by means of thermal decomposition of a gas mixture consisting of a tantalum halide and a silane.

BRIEF DESCRIPTION OF THE DRAWING

The single FIGURE in the drawing illustrates the improved structure of the present invention in a greatly enlarged cross-sectional view.

DESCRIPTION OF THE PREFERRED EMBODIMENTS

Referring to the single FIGURE of the drawing, reference numeral 1 has been applied to a silicon substrate having a heavily doped n+ or p+ region 2 formed therein. A layer of silicon dioxide 3 is applied over the impurity layer and contains the contact hole. A tantalum silicide layer 5 is applied in a thickness of from 100 to 500 nm according to known methods of semiconductor technology such as co-sputtering, co-evaporation or chemical vapor deposition (CVD) processes. The deposition is controlled so that more tantalum than corresponds to the stoichiometric amount required to form the compound $TaSi_2$ is deposited. Preferably, there is at least a 10% excess of tantalum over that required to form the silicide. Another means for applying the layer of tantalum silicide is by high frequency sputtering using a tantalum silicide target consisting of an alloy having a molecular excess of tantalum.

An aluminum layer, for example a Si-doped aluminum layer 6, is deposited on the tantalum silicide layer 5 in a thickness of 500 to 2000 nm and this double layer 5,6 is then structured in common. The aluminum alloy can be any of a number of alloy systems, such as aluminum-copper, aluminum-silicon, aluminum-copper-silicon, or aluminum-silicon-titanium.

It is also possible to deposit the tantalum silicide only in the contact hole as shown by arrow 4 by means of a selective chemical vapor deposition process.

The aluminum layer 6 serves to minimize the track resistance and permits a problem-free bonding. The tantalum silicide layer 5 simultaneously acts as a diffusion barrier and as a contacting material. This is possible since ohmic contacts to n+ and p+ silicon can be produced with tantalum silicide and the Schottky barrier to n-silicon is sufficiently low at 0.59 eV. The use of a tantalum silicide which has a higher tantalum content than required to produce the intermetallic compound tantalum di-silicide prevents the aluminum diffusion during heat treatment steps.

The method of the present invention provides significant advantages over prior art procedures. For example, only two instead of the usual three layers are employed so that the manufacturing processes of etching and deposition are considerably simplified. There is a low reaction depth in (100) type silicon achieved since already a silicide is present instead of the pure metal tending to silicide formation and thus Si-consumption from the substrate. Furthermore, no aluminum diffusion into the contacts occurs. No p-silicon epitaxial growth can occur into the contacts. In addition, the silicon additive can be eliminated in the deposition of the aluminum. The deposition of both layers in the same film deposition set up without breaking the vacuum is possible, for example, with the CVD process. Finally, tantalum silicide has a high current loadability so that a safety margin with interconnect interruptions exists when using silicide everywhere underneath A1.

It should be evident that various modifications can be made to the described embodiments without departing from the scope of the present invention.

We claim as our invention:

1. An integrated semiconductor circuit comprising:
   a substrate of silicon,
   a highly impurity diffused doped silicon layer on said substrate,
   an external interconnect system consisting of aluminum or aluminum alloy, and
   a tantalum silicide layer intermediate said interconnect level and said doped silicon layer, said tantalum silicide having a portion of tantalum therein greater than the amount required stoichiometrically to form the compound $TaSi_2$.

2. A semiconductor circuit according to claim 1 wherein:
   said tantalum silicide contains at least 1.1 moles of tantalum for every 2 moles of silicon.

3. A semiconductor circuit according to claim 1 wherein said aluminum alloy is an aluminum-copper, aluminum-silicon, aluminum-copper-silicon, or aluminum-silicon-titanium alloy.

4. A semiconductor circuit according to claim 1 wherein said tantalum silicide layer has a thickness of from 100 to 500 nm.

5. A semiconductor circuit according to claim 1 wherein said interconnect system consists of a double layer of aluminum and tantalum silicide.

* * * * *